(12) United States Patent
Chen et al.

(10) Patent No.: US 10,587,971 B2
(45) Date of Patent: Mar. 10, 2020

(54) SEMICONDUCTOR DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yijun Chen, Shanghai (CN); Yu Hua, Shanghai (CN); Kuanchieh Yu, Shanghai (CN); Chao Wang, Shanghai (CN); Shan Zhang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

(*) Notice: Subject to any disclaimer, the term of this patent is extended or adjusted under 35 U.S.C. 154(b) by 0 days.

(21) Appl. No.: 15/824,716

(22) Filed: Nov. 28, 2017

(65) Prior Publication Data
US 2018/0152801 A1   May 31, 2018

(30) Foreign Application Priority Data
Nov. 29, 2016   (CN) ........................ 2016 1 1066885

(51) Int. Cl.
*H04R 31/00*   (2006.01)
*B81B 7/00*   (2006.01)
(Continued)

(52) U.S. Cl.
CPC ......... *H04R 31/006* (2013.01); *B81B 7/0061* (2013.01); *H01L 21/31105* (2013.01);
(Continued)

(58) Field of Classification Search
CPC .......... H01L 21/4857; H01L 21/31105; B81B 7/0061
(Continued)

(56) References Cited

U.S. PATENT DOCUMENTS 5,708,302 A    1/1998   Azuma et al.
2004/0147132 A1   7/2004   Nam et al.
(Continued)

FOREIGN PATENT DOCUMENTS

CN    1334962 A    2/2002
CN    101506987 A    8/2009
WO    WO-2016181893 A1 * 11/2016 ........... G11C 11/161

OTHER PUBLICATIONS

European Search Report, EP17203760, dated Apr. 4, 2018, 1 page.

*Primary Examiner* — Binh X Tran
(74) *Attorney, Agent, or Firm* — Innovation Counsel LLP

(57) ABSTRACT

A semiconductor device and its manufacturing method are presented. The manufacturing method includes providing a substrate structure; forming a first metal layer on the substrate structure; forming a second metal layer on the first metal layer; forming a first oxide layer on the second metal layer at a first temperature; and conducting the remaining manufacturing processes including thermal processes at a second temperature that is higher than the first temperature. This method reduces the concentration of the first metal diffused into the surface of the second metal layer during the thermal processes, thus reducing the amount of the oxide of the first metal formed on the surface of the second metal layer. Therefore, it is beneficial to the establishment of metal wire connections.

10 Claims, 6 Drawing Sheets

(51) Int. Cl.
  *H04R 19/00* (2006.01)
  *H01L 21/311* (2006.01)
  *H01L 21/48* (2006.01)
(52) U.S. Cl.
  CPC ....... *H01L 21/4857* (2013.01); *H04R 19/005* (2013.01); *H04R 31/00* (2013.01); *B81B 2201/0257* (2013.01); *H04R 2410/00* (2013.01)
(58) Field of Classification Search
  USPC .................................................. 438/694, 756
  See application file for complete search history.

(56) References Cited

U.S. PATENT DOCUMENTS

| | | |
|---|---|---|
| 2007/0096300 A1 | 5/2007 | Wang et al. |
| 2013/0140950 A1* | 6/2013 | Fuentes-Fernandez ..................... H02N 2/186 310/319 |
| 2013/0285086 A1* | 10/2013 | Hu ........................ H01L 27/156 257/98 |
| 2015/0028381 A1* | 1/2015 | Miki ....................... H01L 33/40 257/99 |
| 2015/0187991 A1* | 7/2015 | McGroddy ........... H01L 27/016 257/13 |
| 2015/0335258 A1* | 11/2015 | Masmanidis ........ A61B 5/6868 600/378 |
| 2016/0268084 A1 | 9/2016 | Gudeman et al. |
| 2017/0141090 A1* | 5/2017 | Bonart .............. H01L 21/76834 |
| 2018/0301622 A1* | 10/2018 | Kubo .................... G11C 11/161 |

* cited by examiner

Cr concentration ($\times 10^{10}$ atoms/cm$^2$)

| Heating time (second) | 150 | 160 | 170 | 180 | 190 | 205 | 210 | 215 | 220 | 230 | 250 | 270 |
|---|---|---|---|---|---|---|---|---|---|---|---|---|
| 1200 |  | 20.4 | 117.1 | 124.2 |  |  |  |  |  |  |  |  |
| 800 | 18.7 |  |  |  |  |  |  |  |  |  |  |  |
| 500 | 4.7 |  |  |  |  |  |  |  |  |  |  |  |
| 480 |  |  | 38.7 |  |  |  | 90.2 |  | 71.7 |  |  |  |
| 360 | 3.6 |  |  | 4.3 | 5.5 | 13.8 | 23.5 | 28.7 |  | 123 |  |  |
| 240 |  |  |  |  |  |  |  | 8.6 |  |  | 124.5 |  |
| 180 |  | 3.1 |  |  |  |  |  |  |  | 13.9 |  | 170 |

Temperature (℃)

SEMICONDUCTOR DEVICE AND MANUFACTURE THEREOF

CROSS-REFERENCE TO RELATED APPLICATION

This application claims priority to and benefit of Chinese Patent Application No. 201611066885.0 filed on Nov. 29, 2016, which is incorporated herein by reference in its entirety.

BACKGROUND

(a) Field of the Invention

This inventive concept relates to semiconductor technology and, more specifically, to semiconductor device and its manufacturing method.

(b) Description of the Related Art

In a microphone manufacturing process, a wire bond pad connecting different wires typically comprises chromium (Cr) and gold (Au). FIG. 1A shows a schematic sectional view of a conductive wire bond pad comprising a Cr layer and an Au layer. The structure shown in FIG. 1A comprises a silicon nitride layer 101 (a film in the microphone), a Cr layer 102 on the silicon nitride layer 101, and an Au layer 103 on the Cr layer 102. Thermal processes (for example, lithography, etching, and ashing processes all involve large amount of heat) that need to be conducted after the wire bond pad is built may cause Cr to diffuse into the surface of the Au layer 103 and form chromium oxide ($CrO_x$) there, which may weaken the shear force of wire connections or even cause the bond to fail.

Conventional methods lower the diffusion activity of Cr, and thus prevent Cr from diffusing into the surface of the Au layer, by capping the peak temperature in the succeeding processes. However, without a sufficiently high temperature in the succeeding processes, the polymer in Deep Reactive Ion Etching (DRIE) cannot be completely removed, and the polymer residue may cause detection problems in the Buffer Oxide Etching (BOE) process.

SUMMARY

The inventors of this inventive concept propose a solution remedying at least one of the drawbacks of the conventional methods.

This inventive concept presents a semiconductor device manufacturing method, comprising:
providing a substrate structure;
forming a first metal layer on the substrate structure;
forming a second metal layer on the first metal layer;
forming a first oxide layer on the second metal layer at a first temperature; and
conducting remaining manufacturing processes including thermal processes at a second temperature higher than the first temperature.

Additionally, in the aforementioned method, the first oxide layer may comprise a silicon-based oxide, and the first temperature may be in a range of 170° C. to 210° C.

Additionally, in the aforementioned method, the thickness of the first oxide layer may be in a range of 1000 Å to 20000 Å.

Additionally, in the aforementioned method, the first metal layer may comprise chromium and the second metal layer comprises gold.

Additionally, in the aforementioned method, the first metal layer and the second metal layer may form a wire bond pad.

Additionally, the aforementioned method may further comprise:
removing the first oxide layer; and
forming a metal wire on the second metal layer.

Additionally, in the aforementioned method, the substrate structure may comprise:
a substrate;
a sacrificial material layer on the substrate; and
a cover layer on the substrate covering the sacrificial material layer, wherein the first metal layer is formed on the cover layer.

Additionally, in the aforementioned method, conducting remaining manufacturing processes including thermal processes may comprise:
forming a patterned mask layer on a back side of the substrate;
etching the substrate using the mask layer as a mask to form a through-hole that exposes the sacrificial material layer; and
removing the mask layer.

Additionally, in the aforementioned method, removing the first oxide layer may comprise:
removing the sacrificial material layer through the through-hole by a Buffer Oxide Etching (BOE) method, wherein the first oxide layer is also removed by the BOE method.

Additionally, the aforementioned method may further comprise:
conducting a thickness reduction process on the back side of the substrate before the patterned mask layer is formed.

This inventive concept further presents a semiconductor device, comprising:
a substrate structure;
a first metal layer on the substrate structure;
a second metal layer on the first metal layer; and
a first oxide layer on the second metal layer.

Additionally, in the aforementioned device, the first oxide layer may comprise a silicon-based oxide formed in a temperature range of 170° C. to 210° C.

Additionally, in the aforementioned device, the thickness of the first oxide layer may be in a range of 1000 Å to 20000 Å.

Additionally, in the aforementioned device, the first metal layer may comprise chromium, and the second metal layer may comprise gold.

Additionally, in the aforementioned device, the first metal layer and the second metal layer may form a wire bond pad.

Additionally, in the aforementioned device, the substrate structure may comprise:
a substrate;
a sacrificial material layer on the substrate; and
a cover layer on the substrate covering the sacrificial material layer, wherein the first metal layer is formed on the cover layer.

BRIEF DESCRIPTION OF THE DRAWINGS

The drawings illustrate some embodiments of this inventive concept and will be used to describe this inventive concept along with the specification.

DETAILED DESCRIPTION OF THE EMBODIMENTS

Figures 1A, 1B:
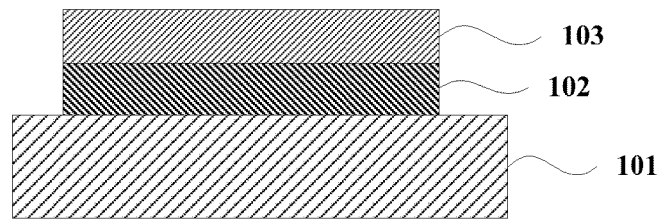
FIG. 1A shows a schematic sectional view of a conductive wire bond pad comprising a chromium (Cr) layer and a gold (Au) layer.
FIG. 1B is a table showing measured Cr concentrations on the surface of the Au layer in an exemplary wire bond pad comprising a Cr layer and an Au layer.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described as being otherwise, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

The inventors of this inventive concept use Total Reflection X-Ray Fluorescence (TXRF) to measure Cr concentration on the surface of the Au layer. FIG. 1B is a table showing measured Cr concentrations on the surface of the Au layer in an exemplary wire bond pad comprising a Cr layer and an Au layer under different thermal conditions (e.g., different temperatures and/or different heating times). For example, FIG. 1B shows that Cr concentration on the surface of the Au layer is $170 \times 10^{10}$ atoms/cm$^2$ when the temperature is 270° C. and the heating time is 180 seconds, and Cr concentration becomes $124.2 \times 10^{10}$ atoms/cm$^2$ when the temperature is 180° C. and the heating time is 1200 seconds. The Cr concentrations in these two examples are considered high, and the chromium oxide formed on the surface of the Au layer is detrimental to metal wire connections.

In some other embodiments, other methods, such as Auger Electron Spectroscopy, Secondary Ion Mass Spectrometer (SIMS), Transmission Electron Microscope (TEM), and Energy Dispersive X-Ray Spectroscopy, may also be used to measure Cr concentration on the surface of the Au layer for the embodiments of this inventive concept.

Figure 2:
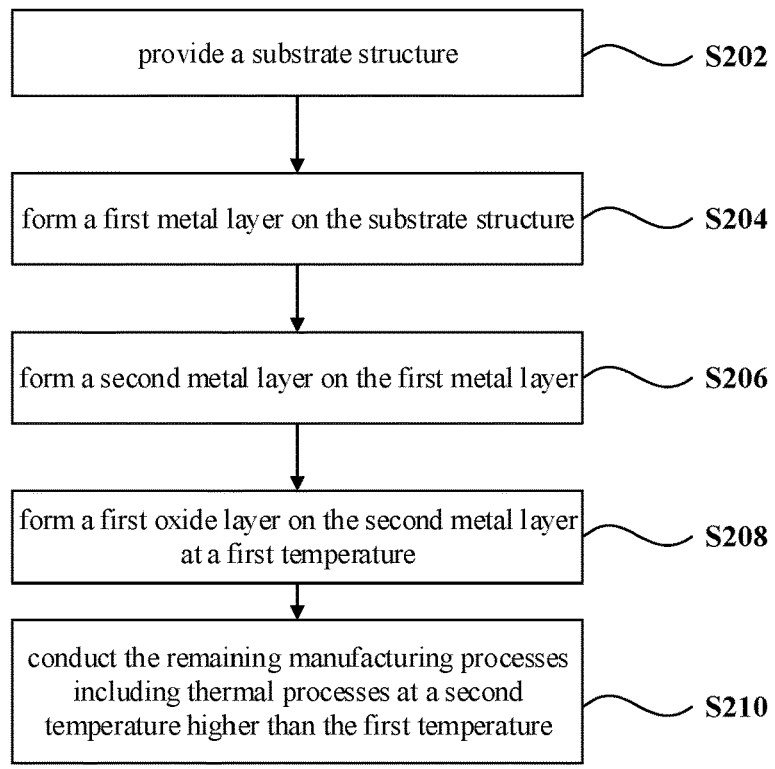
FIG. 2 shows a flowchart illustrating a semiconductor device manufacturing method in accordance with one or more embodiments of this inventive concept.

FIG. 2 shows a flowchart illustrating a semiconductor device manufacturing method in accordance with one or more embodiments of this inventive concept.

In step S202, a substrate structure is provided. The substrate structure may be a semiconductor structure on which a wire bond pad will be formed. For example, the substrate structure may be a structure formed in a microphone manufacturing process. However, it should be understood that this inventive concept is not limited to a microphone manufacturing process and the substrate structure may be some other structures.

In step S204, a first metal layer is formed on the substrate structure. The first metal layer may comprise Cr and may have a thickness of several hundred angstrom. For example, the first metal layer may have a thickness of 750 Å.

In step S206, a second metal layer is formed on the first metal layer. The second metal layer may comprise Au and may have a thickness of several thousand angstrom. For example, the second metal layer may have a thickness of 3000 Å. The first metal layer and the second metal layer form a wire bond pad.

In step S208, a first oxide layer is formed on the second metal layer at a first temperature. In one embodiment, the first oxide layer may comprise Low Temperature Oxide (LTO). For example, the first oxide layer may comprise a silicon-based oxide such as tetraethoxysilane (TEOS) oxide or silane (SiH$_4$) oxide. The first temperature may be in a range of 170° C. to 210° C. For example, the first temperature may be 180° C., 190° C., or 200° C. In one embodiment, the thickness of the first oxide layer may be in a range of 1000 Å to 20000 Å. For example, the first oxide layer may have a thickness of 3000 Å, 6000 Å, 10000 Å or 15000 Å.

In step S210, the remaining manufacturing processes, including thermal processes, are conducted at a second temperature that is higher than the first temperature.

In one embodiment, the first oxide layer is formed on the second metal layer at the first temperature. Since the first temperature is lower than the second temperature at which the remaining manufacturing processes, including thermal processes, are conducted, the first oxide may fill in the grain boundary of the second metal layer, which lowers the concentration of the first metal that will diffuse to the surface of the second metal layer in the thermal processes, which in turn reduces the amount of the oxide of the first metal that will be formed on the surface of the second metal layer.

For example, when a first oxide layer, such as an LTO layer, is formed on the surface of an Au layer, the first oxide may fill in the grain boundary of the Au layer and reduce the concentration of Cr that will diffuse to the surface of the Au layer, which in turn reduces the amount of chromium oxide that will be formed on the surface of the Au layer. This is beneficial to the establishment of metal wire connections after the first oxide layer is removed.

In some embodiments, the manufacturing method may further comprise: removing the first oxide layer. Optionally, after the first oxide layer is removed, the manufacturing method may further comprise: forming a metal wire on the second metal layer. The first oxide layer formed on the second metal layer in the preceding processes helps to reduce the amount of the oxide of the first metal that will be formed on the second metal layer, therefore it is beneficial to the establishment of metal wire connections on the second metal layer of the wire bond pad after the first oxide layer is removed.

FIGS. 3A, 3B, 3C, 3D, 3E, 3F, 3G 3H, 3I, and 3J show schematic sectional views illustrating different stages of a semiconductor device manufacturing method in accordance with one or more embodiments of this inventive concept. FIGS. 3A, 3B, 3C, 3D, 3E, 3F, 3G 3H, 3I, and 3J show a process to form a wire bond pad in a microphone manufacturing process, thus this inventive concept will be herein described with references to this microphone manufacturing process.

Figure 3A:
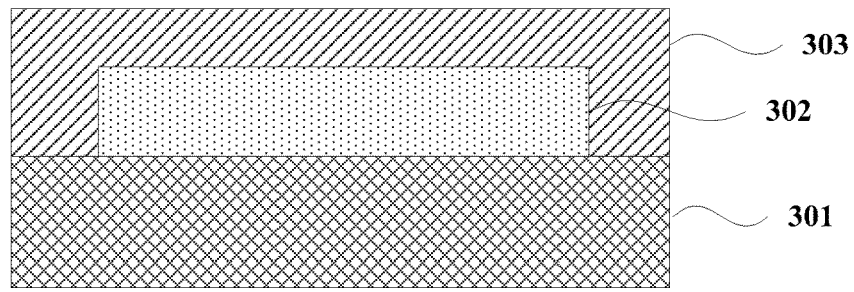
FIGS. 3A, 3B, 3C, 3D, 3E, 3F, 3G; 3H, 3I, and 3J show schematic sectional views illustrating different stages of a semiconductor device manufacturing method in accordance with one or more embodiments of this inventive concept.

Referring to FIG. 3A, a substrate structure is provided. The substrate structure comprises a substrate 301 (such as a silicon substrate), a sacrificial material layer 302 (such as a silicon oxide layer) on the substrate 301, and a cover layer 303 (such as a silicon nitride layer) on the substrate 301 covering the sacrificial material layer 302.

It should be understood that, for the purpose of conciseness and convenience, some components or details that are well known to one of ordinary skill in the art in this field are omitted in the drawings of this application. For example, FIG. 3A does not show some films or structures, such as the electrode plate and the vibration film, of a microphone. These omissions, however, do not prevent one of ordinary skill in the art in this field to make and use the inventive concept herein disclosed.

Figure 3B:
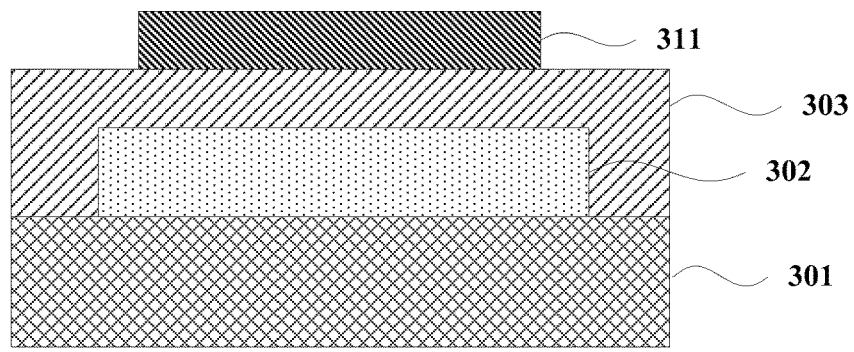

Referring to FIG. 3B, a first metal layer 311 is formed on the substrate structure. The first metal layer 311 may comprise Cr and may be formed on the cover layer 303 by deposition.

Figure 3C:
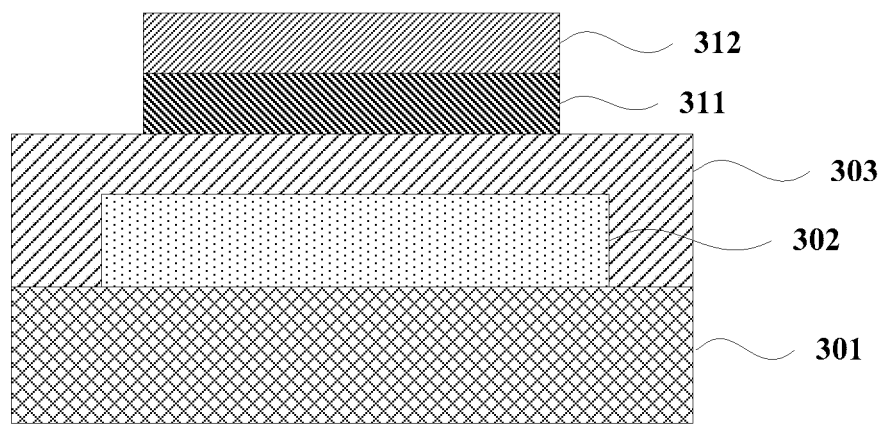

Referring to FIG. 3C, a second metal layer 312 is formed on the first metal layer 311. The second metal layer 312 may comprise Au and may be formed on the first metal layer 311 by deposition.

Figure 3D:
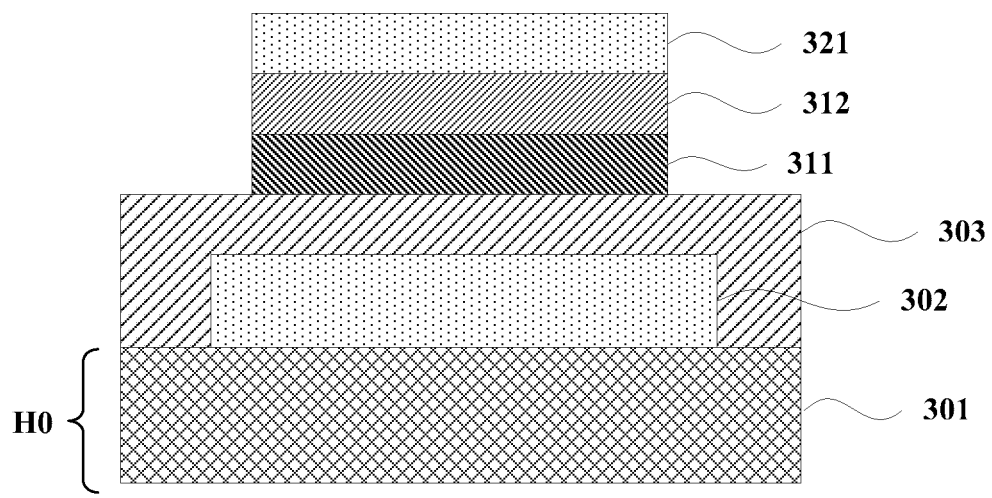

Referring to FIG. 3D, a first oxide layer 321 is formed on the second metal layer 312 by deposition at a first temperature. In one embodiment, the first oxide layer 321 comprises Low Temperature Oxide (LTO). The first oxide layer 321 may comprise a silicon-based oxide, and the first temperature may be in a range of 170° C. to 210° C. For example, the first temperature may be 180° C., 190° C., or 200° C. In one embodiment, the thickness of the first oxide layer 321 may be in a range of 1000 Å to 20000 Å. For example, the first oxide layer 321 may have a thickness of 3000 Å, 6000 Å, 10000 Å or 15000 Å.

Figure 3E:
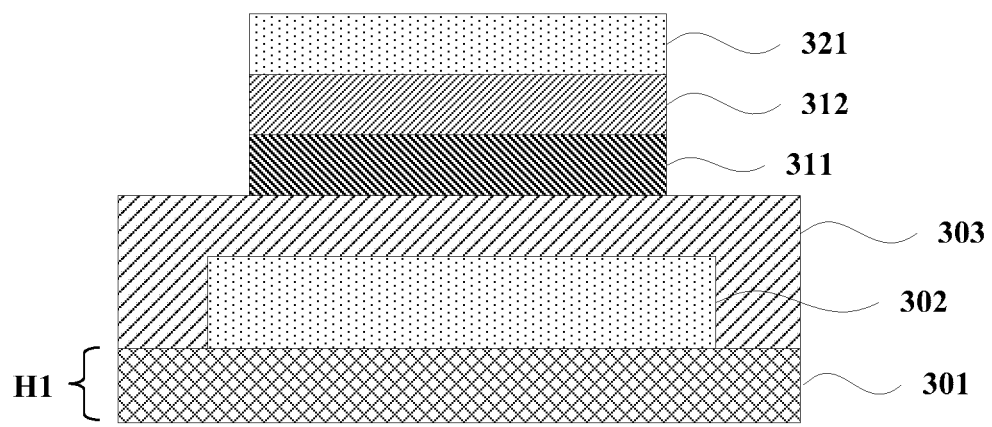

Referring to FIG. 3E, optionally, a thickness reduction process may be applied on a backside of the substrate 301, which is a side of the substrate 301 that is opposite the side on which the first metal layer 311 is formed. For example, the thickness reduction process may reduce the thickness of the substrate 301 from H0 as shown in FIG. 3D, to H1 as shown in FIG. 3E, wherein H1 is smaller than H0. For example, the thickness reduction process may reduce the thickness of the substrate 301 from 725 Å to 400 Å.

Figure 3F:
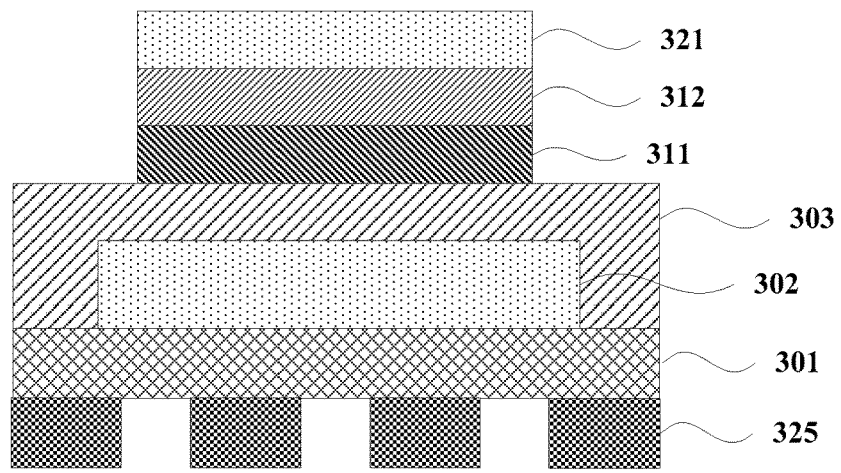
Figure 3G:
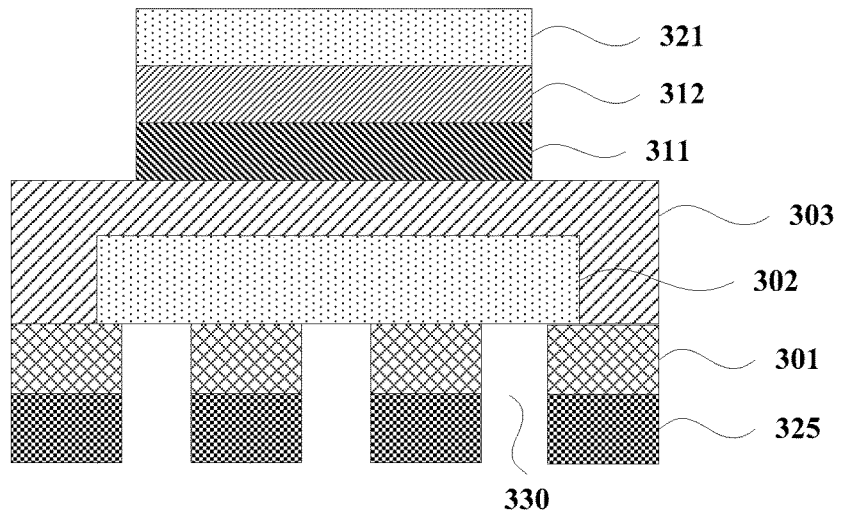
Figure 3H:
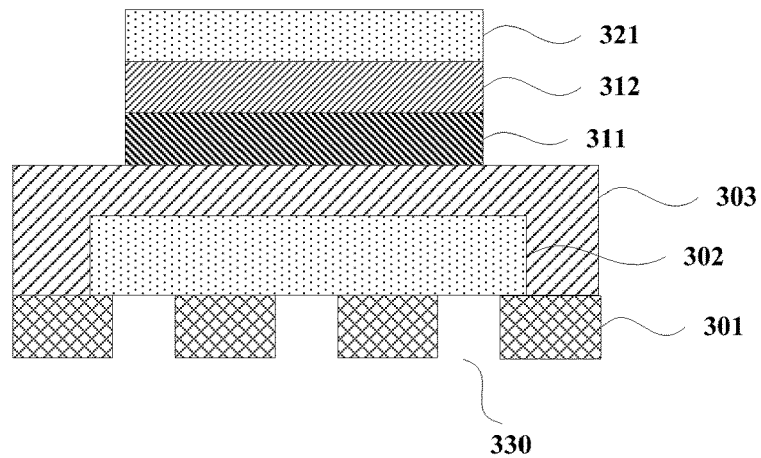

Next, the remaining manufacturing processes including thermal process are conducted. FIGS. 3F, 3G and 3H illustrate conducting the remaining manufacturing processes including thermal processes in accordance with one or more embodiments of this inventive concept.

The remaining manufacturing processes including thermal processes may comprise forming a patterned mask layer 325 (such as a photoresist layer) on the back side of the substrate 301, as shown in FIG. 3F; and etching the substrate 301 using the mask layer 325 as a mask to form a through-hole 330 that exposes the sacrificial material layer 302, as shown in FIG. 3G A plurality of the through-holes 330 may be formed, as shown in FIG. 3G The remaining manufacturing processes may further comprise removing the mask layer 325 through an ashing process, as shown in FIG. 3H.

In the manufacturing processes just described, the processes to form the mask layer 325, to etch the substrate 301, and to remove the mask layer 325 may all be conducted in a high temperature environment, which may cause the first metal (e.g. Cr) to diffuse into the surface of the second metal layer (e.g. Au). However, since a first oxide layer 321 (e.g. the LTO layer) has been formed on the second metal layer 312, the first oxide may fill in the grain boundary of the second metal layer and lower the concentration of the first metal that will diffuse to the surface of the second metal layer, which in turn reduces the amount of the oxide of the first metal that will be formed on the surface of the second metal layer.

Figure 3I:
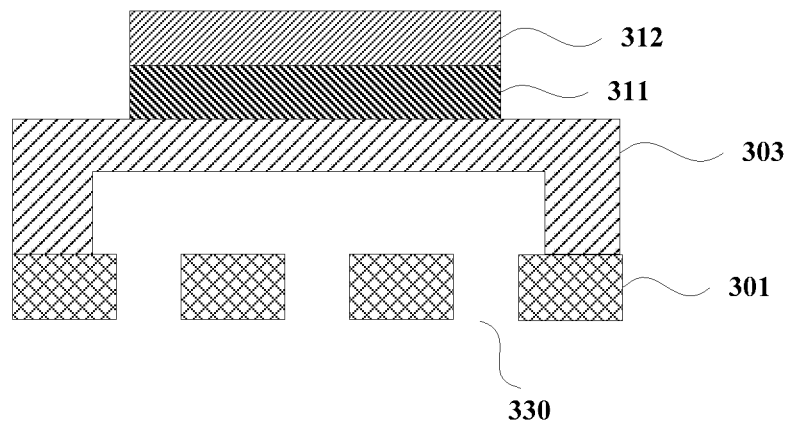

Referring to FIG. 3I, a cavity is formed by removing the sacrificial material layer 302 through the through-holes 330 by a BOE method. The first oxide layer 321 may also be removed by the BOE method in this step. In some embodiments, the first oxide layer is an LTO layer that comprises low temperature deposition oxide that has a loose structure, so it can be easily removed by the BOE method.

Figure 3J:
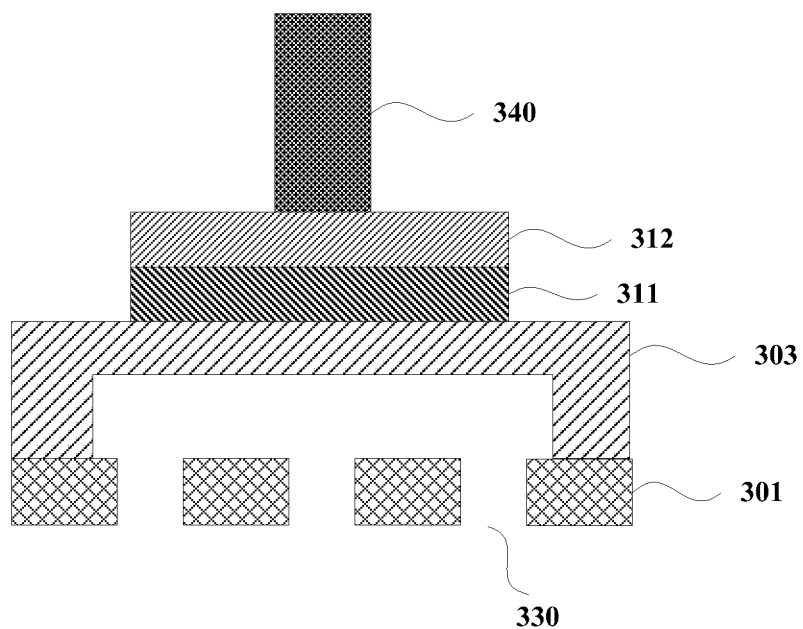

Referring to FIG. 3J, a metal wire 340 is formed on the second metal layer 312. The metal wire 340 may be made of a metallic material such as aluminum, copper, or tungsten, and can be used as a connection wire.

This concludes a semiconductor device manufacturing method in accordance with one or more embodiments of this inventive concept. This manufacturing method forms a wire bond pad that can be used for metal wire connections in a microphone. This manufacturing method can lower the concentration of the first metal diffused into the surface of the second metal in the thermal processes. For example, it reduces the concentration of Cr diffused into the surface of the Au layer, thus reducing the amount of the oxide of the first metal (e.g. chromium oxide) formed during the process. Therefore, the method is beneficial to the establishment of metal wire connections.

Figure 4:
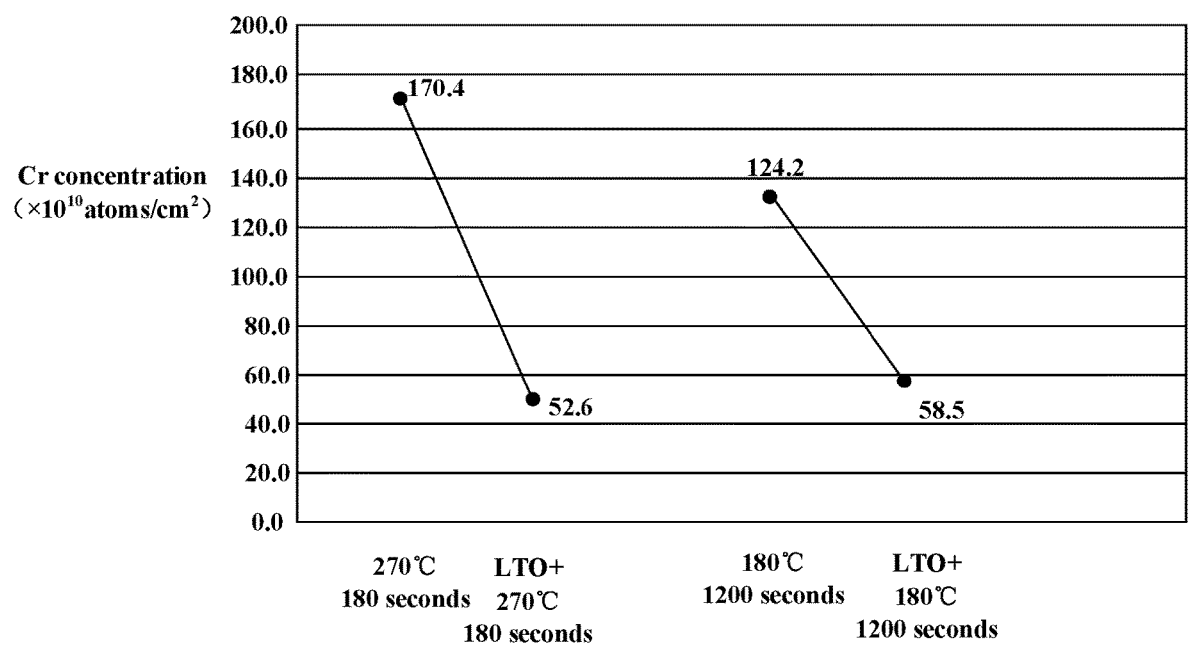
FIG. 4 shows a graph illustrating measured Cr concentrations on the surface of the Au layer on different examples.

FIG. 4 shows a graph illustrating measured Cr concentrations on the surface of the Au layer on different examples. FIG. 4 shows data obtained under two different conditions, one with an LTO layer formed on the surface of the Au layer (labeled with "LTO+") and the other without.

As shown in FIG. 4, at a temperature of 270° C. and a heating time of 180 seconds, Cr concentration on the surface of the Au layer is $170.4 \times 10^{10}$ atoms/cm$^2$ when there is no LTO layer formed on the Au layer, and Cr concentration reduces to $52.6 \times 10^{10}$ atoms/cm$^2$ when there is an LTO layer. In another example, at a temperature of 180° C. and a heating time of 1200 seconds, Cr concentration on the surface of the Au layer is $124.4 \times 10^{10}$ atoms/cm$^2$ when there is no LTO layer formed on the Au layer, and Cr concentration reduces to $58.5 \times 10^{10}$ atoms/cm$^2$ when there is an LTO layer. Therefore the existence of an LTO layer on the surface of the Au layer dramatically reduces Cr concentration on the surface of the Au layer.

This inventive concept further presents a semiconductor device. Referring to FIG. 3D, this semiconductor device comprises a substrate structure comprising a substrate 301, a sacrificial material layer 302 on the substrate 301, and a cover layer 303 on the substrate 201 covering the sacrificial material layer 302.

Referring to FIG. 3D, this semiconductor device further comprises a first metal layer 311 on the substrate structure. The first metal layer 311 may comprise Cr and may be formed on the cover layer 303.

Referring to FIG. 3D, this semiconductor device further comprises a second metal layer 312 on the first metal layer 311. The second metal layer 312 may comprise Au. In one embodiment, the first metal layer 311 and the second metal layer 312 form a wire bond pad for metal wire connections.

Referring to FIG. 3D, this semiconductor device further comprises a first oxide layer 321 on the second metal layer 312. The first oxide layer 321 may be an LTO layer. For example, the first oxide layer 321 may comprise a silicon-based oxide formed in a temperature range of 170° C. to 210° C. (e.g. 180° C., 190° C., or 200° C.). In one embodiment, the thickness of the first oxide layer 321 is in a range of 1000 Å to 20000 Å. For example, the first oxide layer 321 may have a thickness of 3000 Å, 6000 Å, 10000 Å or 15000 Å.

The semiconductor device of this inventive concept can reduce the concentration of the first metal diffused into the surface of the second metal layer in the manufacturing processes including thermal processes. For example, it can reduce the concentration of Cr diffused into the surface of the Au layer, therefore it is beneficial to the establishment of metal wire connections on the second metal layer after the first oxide layer is removed.

This concludes the description of a semiconductor device and its manufacturing method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device, comprising:
   a semiconductor substrate structure;
   a first metal layer on the semiconductor substrate structure;

a second metal layer on the first metal layer, wherein a first face of the second metal layer directly contacts a face of the first metal layer and is parallel to the face of the first metal layer; and a first oxide layer on the second metal layer, wherein the first oxide layer directly contacts a second face of the second metal layer while completely exposing a third face of the second metal layer, and wherein the second face of the second metal layer overlaps the first face of the second metal layer and is connected through the third face of the second metal layer to the first face of the second metal layer, wherein the semiconductor substrate structure comprises:

a semiconductor substrate;

a sacrificial material layer on the semiconductor substrate; and a cover layer directly contacting the semiconductor substrate and covering the sacrificial material layer, wherein the first metal layer is on the cover layer.

2. The semiconductor device of claim 1, wherein the first oxide layer comprises a silicon-based oxide formed in a temperature range of 170° C. to 210° C.

3. The semiconductor device of claim 1, wherein the thickness of the first oxide layer is in a range of 1000 Å to 20000 Å.

4. The semiconductor device of claim 1, wherein the first metal layer comprises chromium, and the second metal layer comprises gold.

5. The semiconductor device of claim 1, wherein the first metal layer and the second metal layer form a wire bond pad.

6. The semiconductor device of claim 1, wherein the first metal layer is narrower than a cavity of the cover layer.

7. The semiconductor device of claim 1, wherein the cover layer completely covers at least three faces of the sacrificial material layer.

8. The semiconductor device of claim 1, wherein a face of the sacrificial material layer overlaps the first metal layer and is wider than the first metal layer.

9. The semiconductor device of claim 1, wherein a face of the sacrificial material layer overlaps the first oxide layer and is wider than the first oxide layer.

10. A semiconductor device, comprising:

a substrate structure comprising a semiconductor substrate, a sacrificial material layer, and a cover layer, wherein the cover layer comprises a cavity and a face, wherein the sacrificial material layer is positioned in the cavity, wherein the face overlaps the semiconductor substrate and includes a first face portion and a second face portion, and wherein the first face portion is directed connected to the second face portion and is coplanar with the second face portion;

a first metal layer positioned between two opposite edges of the cavity of the cover layer, directly contacting the first face portion, covering the first face portion, and exposing the second face portion;

a second metal layer directly contacting the first metal layer; and a first oxide layer directly contacting the second metal layer, overlapping the first face portion, and exposing the second face portion.

* * * * *